United States Patent
Kurz et al.

(10) Patent No.: US 10,151,799 B2
(45) Date of Patent: Dec. 11, 2018

(54) DETECTION OF BENDING EFFECTS IN THE CASE OF ELECTRIC DRIVES

(71) Applicant: Robert Bosch GmbH, Stuttgart (DE)

(72) Inventors: Roland Kurz, Leonberg (DE); Thomas Herges, Eberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 646 days.

(21) Appl. No.: 14/271,598

(22) Filed: May 7, 2014

(65) Prior Publication Data
US 2014/0333343 A1    Nov. 13, 2014

(30) Foreign Application Priority Data
May 8, 2013    (DE) .......................... 10 2013 208 542

(51) Int. Cl.
*G01R 31/34*    (2006.01)

(52) U.S. Cl.
CPC ........... *G01R 31/34* (2013.01); *G01R 31/343* (2013.01)

(58) Field of Classification Search
CPC ....................................................... G01R 31/34
USPC .......................................................... 324/765
See application file for complete search history.

(56) References Cited

U.S. PATENT DOCUMENTS

| | | | | |
|---|---|---|---|---|
| 2002/0178791 A1* | 12/2002 | Shigihama | ......... | F02M 25/0818 73/49.2 |
| 2005/0092841 A1* | 5/2005 | Barkan | .............. | G06K 7/10633 235/462.25 |
| 2008/0315909 A1* | 12/2008 | Romano | ............... | B60L 3/0038 324/765.01 |
| 2011/0276279 A1* | 11/2011 | Pasuri | ..................... | H04Q 9/00 702/35 |
| 2011/0303427 A1* | 12/2011 | Tang | ..................... | B23P 19/066 173/1 |
| 2012/0200966 A1* | 8/2012 | Hill | ....................... | G01R 31/024 361/62 |
| 2013/0057187 A1* | 3/2013 | Malich | .................. | H02P 29/021 318/434 |

FOREIGN PATENT DOCUMENTS

| | | |
|---|---|---|
| DE | 19636431 | 3/1998 |
| DE | 10133826 | 2/2003 |

* cited by examiner

*Primary Examiner* — Son Le
*Assistant Examiner* — Akm Zakaria
(74) *Attorney, Agent, or Firm* — Michael Best & Friedrich LLP

(57) ABSTRACT

A method and a corresponding system for detecting a malfunction in an electric drive unit. The method comprises the following steps: ascertain (S17) a current flow characteristic (1) of an electric drive unit; detect (S33) a gradient change in the current flow characteristic (1) at a first point in time (t=n); compare (S35, S39) the gradient change with a predefinable gradient change range; establish (S45) a malfunction in the electric drive unit if the gradient change is outside the predefinable gradient change range.

11 Claims, 2 Drawing Sheets

DETECTION OF BENDING EFFECTS IN THE CASE OF ELECTRIC DRIVES

BACKGROUND OF THE INVENTION

It is possible in the case of electric drives to capture the current that is supplied to the motor and to use said current by way of example for controlling the drive. Moreover, this current can be used for measuring indirect variables. By way of example, the electric drive can be embodied as part of a tank leakage diagnostic pump (DMTL). In this case, a conclusion regarding the pressure in the tank can be drawn by means of measuring the motor current.

Malfunctions or rather defective functions of the electric drive can influence the current measurement and lead to incorrect measurements. Malfunctions of this type can lead to an inaccurate control of the electric drive or to an incorrect diagnosis when interpreting the measured values. By way of example, in the event of a tank leakage diagnostic pump, malfunctions in the electric drive can lead to a leakage being indicated even though the tank system does not have a leak.

SUMMARY OF THE INVENTION

There is therefore a requirement for an improved method and a corresponding improved system that render it possible in particular to detect in a reliable manner a malfunction in an electric drive.

Features, details and possible advantages of a device in accordance with embodiments of the invention are discussed in detail hereinunder.

In accordance with a first aspect of the invention, a method is provided for detecting a malfunction in an electric drive unit. The method comprises the following steps:

Ascertain a current flow characteristic of the electric drive unit;
Detect a gradient in the current flow characteristic and accordingly at a first point in time;
Compare the gradient change with a predefinable gradient change range;
Establish a malfunction of the electric drive unit if the gradient change is outside the predefinable gradient change range.

In other words, the idea of the present invention is based inter alia on the knowledge that an electric drive unit that is connected to another component such as for example a pump is subjected to particular malfunctions such as for example the bending effect. In the case of the bending effect, a rotor is decelerated and accelerated and these procedures are transmitted to the electric drive unit. The rotor can be for example a rotor of a pump, in particular of a tank leakage diagnostic pump. The method in accordance with the invention renders it possible to ascertain by way of obvious gradient changes in the current characteristic line beyond the drive frequency range that a frequency band in which the deceleration and acceleration procedures are noticeable has been entered or exited. In particular, the bending effect can cause "bends" in the current flow characteristic and accordingly can lead to an S-shaped or rather Z-shaped curve of the current flow characteristic.

It is possible using the method in accordance with the invention to detect gradient changes that are typical when a malfunction is present and as a consequence it is possible by way of example to detect mechanical malfunctions in the electric drive unit. Measurements that would indicate the presence of a malfunction in the electric drive unit can be by way of example discarded. As an alternative or in addition thereto, critical components of the electric drive unit can be classified as defective.

The malfunction in the electric drive unit can be caused by way of example by a mechanical connection between the electric drive unit and another component such as for example a vane pump. In particular, a so-called coupling clatter can occur as a result of the rigidity of the coupling of the two components and in defined frequency ranges this clatter can influence the current measurement and lead to incorrect measurements.

By way of example, the play in the rotor on the drive shaft of the rotor can cause oscillations in the radial direction. If the magnitude of the oscillation is in the resonance range, then this additional energy requirement leads to a deceleration of the electric motor and consequently to an increase in current. After passing through the resonance frequency range, the previously stored energy is released so that the motor rotational speed increases and the current consumption reduces.

These deceleration and acceleration procedures can be measured by way of the counter EMF, in other words it is possible to measure the voltage that is induced in the windings of the rotor. Consequently, the deceleration and acceleration procedures can be mapped in the current signal of the electric drive unit. In the case of conventional measuring methods, these deceleration and acceleration procedures are frequently not detected by way of example as a result of filtering or as a result of a sampling frequency that is too low.

In contrast, the method in accordance with the invention is designed so as to ascertain the deceleration and acceleration procedures of the rotor with the aid of gradient changes in the current flow characteristic.

The current flow characteristic can represent by way of example the graph of the motor current in a pump, in particular a vane pump, for example during a tank leakage diagnostic procedure. The electric drive unit is operated at a constant voltage. While ascertaining the current flow characteristic, it is possible to measure or rather ascertain the current values by way of example at regular time intervals, for example every 10 to 30 seconds, preferably every 20 seconds. Alternatively, the sampling frequency can be varied.

A gradient change in the current flow characteristic can be detected by way of example by means of forming the second derivative or by forming a differential between gradients in the current flow characteristic at different points in time. The gradient change can also be described as a gradient transition.

Following the detection of the gradient change, the gradient change is compared with a predefined gradient change range. In other words, the detected gradient change is compared with an upper or rather first threshold value and moreover is compared with a lower or rather second threshold value. By way of example, the first threshold value of the gradient change can be 0.07 mA/s$^2$, in particular 0.05 mA/s$^2$ and preferably 0.03 mA/s$^2$. Moreover, the second threshold value for the gradient change can be by way of example −0.1 mA/s$^2$, in particular −0.08 mA/s$^2$ and preferably −0.05 mA/s$^2$.

If the detected gradient change is outside the predefinable or rather the predefined gradient change range, then a malfunction in the electric drive unit is established. If the reliable or rather predefined gradient change range is defined by way of example with −0.05 mA/s$^2$ up to 0.03 mA/s$^2$ and if the detected gradient change is greater than 0.03 mA/s² or less than −0.05 mA/s², then a malfunction in the electric drive unit is established.

The process of establishing a malfunction can include by way of example the process of generating of a malfunction signal or rather a defect signal. Moreover, the process of establishing a malfunction can include the process of storing or rather outputting a malfunction signal. It is possible by way of example to store a signal during a tank leakage diagnostic procedure, said signal indicating that there is a malfunction in the electric drive unit and that the measurement results of the tank leakage diagnostic procedure are where appropriate to be discarded. Alternatively, the process of establishing a malfunction can lead directly to the termination of the tank leakage diagnostic procedure.

In accordance with one exemplary embodiment of the invention, the method moreover comprises the following steps:

Ascertain a gradient in a current flow characteristic at a second point in time;
Compare the gradient with a predefinable gradient range;
Establish a malfunction in the electric drive unit only if both the gradient change is outside the gradient change range and also the gradient is outside the gradient range.

The second point in time can be prior to or after the first point in time. It is preferred that the gradient in the current flow characteristic is ascertained prior to the gradient change.

Following the detection of the gradient, the value that is ascertained for the gradient is compared with a predefined gradient range. The predefined gradient range has an upper or rather third threshold value and a lower or rather fourth threshold value. The third threshold value for a gradient can be by way of example 1 mA/s, in particular 0.8 mA/s and preferably 0.5 mA/s. The fourth threshold value can be by way of example −0.07 mA/s, in particular −0.05 mA/s and preferably −0.02 mA/s.

By virtue of the fact that two conditions must be fulfilled before a malfunction in the electric drive unit is established, the method can be adjusted to suit specific malfunctions in the electric drive unit, such as for example to detect the bending effect. In particular, the method can detect with a greater degree of reliability a malfunction, in particular a typical malfunction in the electric drive unit. If the two above mentioned conditions are fulfilled, it is then possible to detect a "bend" in the current flow characteristic in contrast to a 'rounded' gradient change.

In accordance with a further exemplary embodiment of the invention, the method further comprises the following step:

Establish a malfunction in the electric drive unit only if in addition a time interval between the first point in time and the second point in time exceeds a predefinable threshold value.

The predefinable threshold value can be described as a fifth threshold value. The fifth threshold value can be by way of example 30 seconds, in particular 20 seconds and preferable 10 seconds.

It is necessary in the present exemplary embodiment to fulfill in total three conditions in order to establish a malfunction in the electric drive unit. On the one hand, the gradient in the current flow characteristic at a second point in time is outside a predefined gradient range. Moreover, a gradient change in the current flow characteristic must be present at a first point in time. This gradient change must be outside a predefined gradient change range. In addition, there must be a predefined minimum time interval between the first and the second point in time.

By virtue of the fact that these three conditions must be fulfilled before a malfunction in the electric drive unit is established, the method can be performed in a more exact manner. In particular, it is possible, by virtue of predefining a minimum time interval between detecting a gradient outside a predefined range and detecting a gradient change outside a predefined gradient change range, to create a criterion that renders it possible to quantify the malfunction.

In accordance with a further exemplary embodiment of the invention, the malfunction in the electric drive unit is established if a rotor of the electric drive unit performs a radial oscillation in the resonance range, in particular in the resonance range of the mechanical coupling to another component, such as for example a vane pump. In other words, the method is performed in order to establish a malfunction in the electric drive unit if the electric motor is decelerated as a result of a bending effect.

In accordance with a further exemplary embodiment of the invention, a malfunction in the electric drive unit is established if the rotor of the electrical drive unit outputs energy that is stored as a result of oscillations in the resonance range. In other words, the method is performed in order to establish a malfunction in the electric drive unit if the rotor of the electric drive unit is accelerated once the bending effect is terminated. In particular, the method can be performed in order to detect multiple gradient changes in the current flow characteristic. By way of example, the method can be performed in order to detect S-shaped gradient changes in the current flow characteristic.

In accordance with a further exemplary embodiment of the invention, the method includes moreover the following step: output a defect signal after a malfunction has been established. By way of example, the defect signal can be an optical or acoustic indication of a malfunction in the electric drive unit. As an alternative or in addition thereto, the defect signal can include an interruption or rather termination of the operation of the electric drive unit. In particular, the result of a tank leakage diagnostic procedure can by way of example be discarded after a malfunction in the electric drive unit has been established.

In accordance with a further exemplary embodiment of the invention, the electric drive unit is embodied as a part of a pressure source. The current flow characteristic is ascertained by introducing a pressure difference by means of the pressure source into a tank. A conclusion regarding the presence of a leakage or a lack of leakage in the tank is drawn from the current flow characteristic. The method is performed as part of a tank leakage diagnostic procedure. In other words, the method is performed within the scope of a tank leakage diagnostic procedure for example with the aid of a control unit of a motor vehicle.

In accordance with a second aspect of the invention, a system is provided for detecting a malfunction in an electrical drive unit. The system comprises a control unit and at least one sensor. The sensor is designed so as to ascertain a current flow characteristic of the electric drive unit and to transmit said current flow characteristic to the control unit. The control unit is designed so as to detect a gradient change in the current flow characteristic at a first point in time. Moreover, the control unit is designed so as to compare the gradient change with a predefinable gradient change range and to establish a malfunction in the electric drive unit if the gradient change is outside the predefinable gradient change range. The predefinable gradient change range can be stored for example in a storage unit of the control unit. The control unit can be by way of example a control device in a motor vehicle.

BRIEF DESCRIPTION OF THE DRAWINGS

Further features and advantages of the present invention will be evident to the person skilled in the art from the following description of exemplary embodiments, which are however not to be regarded as limiting the invention, with reference to the accompanying drawings.

DETAILED DESCRIPTION

Figure 1:
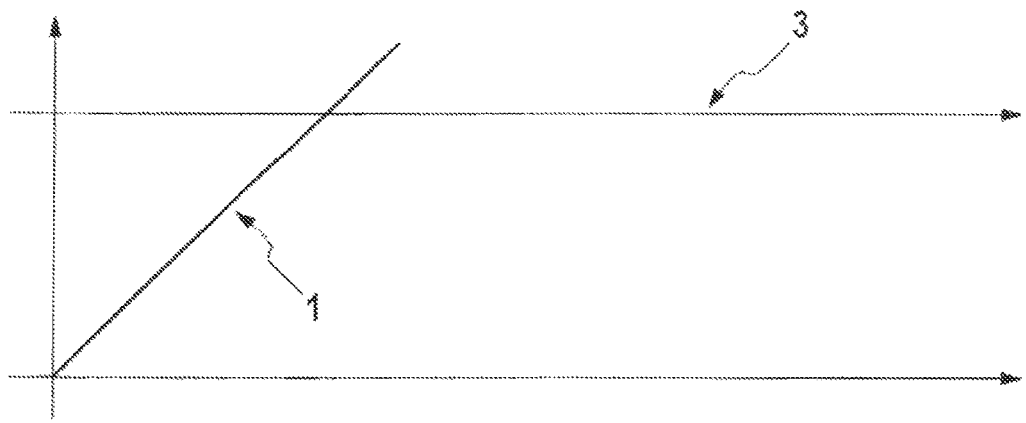
FIG. 1 illustrates a curve of a current flow characteristic during a tank leakage diagnostic procedure if there is no leakage in the tank.

All figures are merely schematic illustrations of devices in accordance with the invention or rather of their components in accordance with exemplary embodiments of the invention. In particular, spacings and relative sizes are not illustrated true-to-scale in the figures. Like elements are provided with like reference numerals in the different figures.

The method is explained in the figures by way of example with reference to a current flow characteristic 1 that is ascertained for example within the scope of a tank leakage diagnostic procedure. A tank leakage diagnostic procedure can be used by way of example for testing the leak tightness of a container for example in the chemical industry, in process engineering or in the automotive industry. In particular, a tank leakage diagnostic procedure can be used for testing the leak tightness of a tank system.

It is possible to use by way of example a pump, in particular a vane pump, for the purpose of pumping air into the tank. The pump can be operated by means of an electric drive unit that comprises an electric motor having a rotor and a stator. If the electric drive unit is operated by way of example at a constant voltage then it is possible by means of measuring the motor current or rather measuring the counter EMF to draw a conclusion regarding the pressure in the vehicle tank.

In the ideal case, a current flow characteristic extends in a linear manner in the case of a tank leakage diagnostic pump if there is no leakage in the tank. In other words, the current that is supplied to the motor of the pump increases as the pressure rises in the tank. If, on the other hand, there is a leakage in the tank, the pressure in the tank rises at least less quickly so that a current limit value is possibly not achieved in a predefined period of time and a leakage is detected in this manner.

FIG. 1 illustrates the curve of a current flow characteristic 1 during the tank leakage diagnostic procedure if there is no leakage in the tank. The time t in seconds is plotted on the x axis and the current is plotted in mA on the y axis. If, as illustrated in FIG. 1, there is no leakage in the tank, the current increases continuously as the pressure in the tank rises. If the current flow characteristic 1 achieves within a predefined period of time of by way of example 3-10 minutes a limit value 3 for a leakage detection, it is possible to assume that there is no leakage in the tank. The limit value 3 can correspond for example to a pressure inside the tank of 35 mbar.

Figure 2:
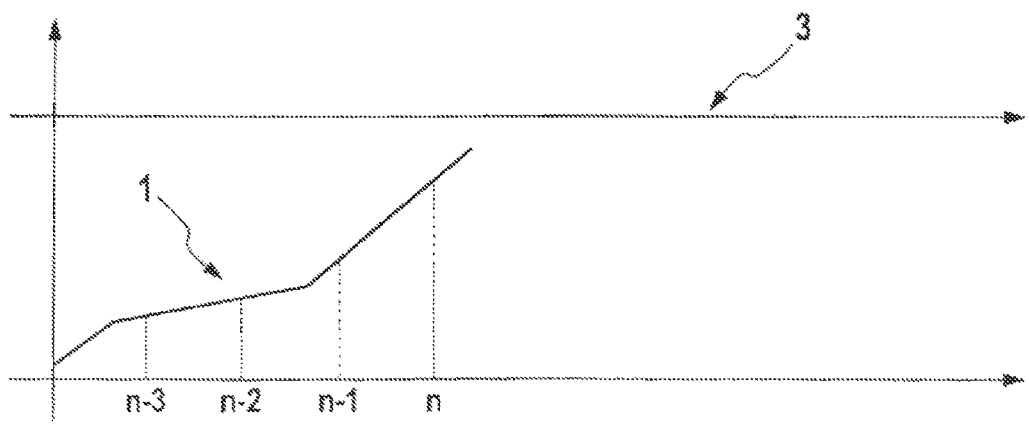
FIG. 2 illustrates a curve of a current flow characteristic during a tank leakage diagnostic procedure showing the bending effects in the electric drive unit if there is no leakage in the tank.

FIG. 2 illustrates the curve of the current flow characteristic 1 in the case of a malfunction in the electric drive unit in particular in the case of a bending effect occurring. In the case of the bending effect caused by the rigidity of a coupling between the electric drive unit and the pump, the rotor of the electric drive unit is decelerated and accelerated. In particular, the rotor can be excited in the resonance range into oscillations in the radial direction. The electric drive unit energy increases and the rotor is decelerated. After passing through the resonance frequency range, the previously stored energy is released, the motor rotational speed increases and the current consumption reduces. The deceleration and acceleration procedures that are typical for the malfunction of the electric drive unit are noticeable by virtue of the gradient changes in the current flow characteristic 1, as illustrated in FIG. 2.

In the event of the bending effect occurring, the curve of the current flow characteristic 1 can extend as a result of the deceleration and acceleration procedures of the rotor so that the current flow characteristic 1 does not achieve the predefined limit value 3 for the leakage detection within the predefined time period and as a consequence a leakage is indicated even though there is actually no leakage in the tank.

In accordance with the method in accordance with the invention, the current flow characteristic 1 is examined for "bends" of this type. By way of example, FIG. 2 illustrates a "bend" between the points in time t=n−2 and t=n−1. As soon as a bend or rather a gradient change that is outside a predefined gradient change range is detected, the tank leakage diagnostic measurement can be discarded. In addition or as an alternative thereto, components of the electric drive unit can be classified as defective.

Figure 3:
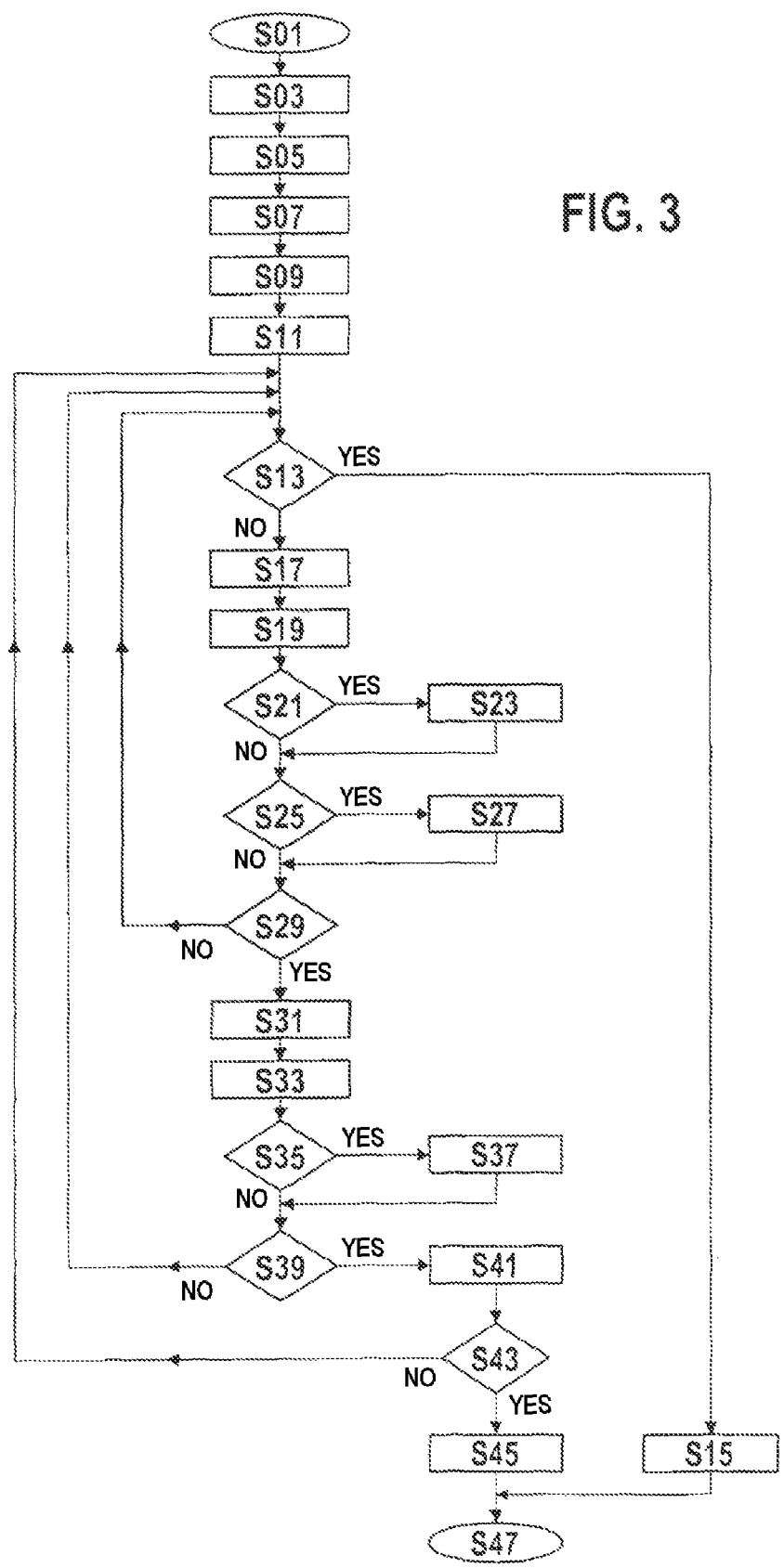
FIG. 3 illustrates a flow diagram of a method for detecting a malfunction in the electric drive unit in accordance with an exemplary embodiment of the invention.

The method is explained hereinunder in detail with reference to FIG. 3. Multiple steps that are illustrated in FIG. 3 are optional.

In step S01, the method is started by way of example in a control unit of a motor vehicle. In the optional step S03, a defect memory checks for defects that have been stored at an earlier stage. By way of example, a check is performed in step S03 as to whether a leakage has already been detected within the scope of a smoke gas leakage search. Moreover, a leakage detection procedure is reset in the optional step S05 to "no leakage found". In the optional step S07, a leakage diagnostic procedure can be performed by means of a workshop tester. By way of example, a smoke gas leakage diagnostic procedure can be performed. In the optional step S09, a waiting time of x seconds, by way of example 3 seconds, is implemented until a stationary state is achieved in the tank and at the electric drive unit. Moreover, a first time stamp is set to 0.

In step S11, a first current measurement value is read in by way of example at a point in time t=0. In step S13, a check is performed as to whether the tank leakage diagnostic procedure has already been completed. If the tank leakage diagnostic procedure has already been completed, a termination of the tank leakage diagnostic procedure is not initiated in step S15. Moreover, the method for detecting a malfunction in the electric drive unit is terminated in step S47. If, on the other hand, it is established in step S13 that the tank leakage diagnostic procedure has not yet been completed, then a current measurement value is read in at the time t=n in step S17. Moreover, a gradient of the current flow characteristic 1 is ascertained in step S19 from the current measurement values at t=n−1 and t=n.

In step S21, the ascertained gradient is compared with a lower or rather a fourth threshold value. The fourth threshold value can be by way of example −0.02 mA/s. If the gradient of the current flow characteristic 1 between the current measurement values at t=n−1 and t=n is below the second threshold value, then a second time stamp is incremented or rather set in step S23 at the time t=n. If, on the other hand, the gradient is above the fourth threshold value, then the gradient is compared in step S25 with an upper or rather third threshold value. The third threshold value can be for example 0.05 mA/s. If the ascertained gradient is above the third threshold value, then the first time stamp is incremented or rather set in step S27 at the time t=n. The comparison with the fourth and third threshold value in steps S21 and S25 corresponds to the comparison of the gradient of the current flow characteristic 1 with a predefined gradient range.

If, on the other hand, the gradient of the current flow characteristic curve 1 is below the first threshold value, then step S29 is performed immediately following step S25. In step S29, a check is performed as to whether the number of the ascertained current measurement values is greater than 3. If the number of the ascertained current measurement values is less than 3, then the method returns to step S13. If, on the other hand, the number of ascertained current measurement values is greater than 3, then the method continues with step S31. In step S31, a gradient is ascertained from the current measurement values at t=n−2 and at t=n−3. Subsequently, a gradient change is ascertained or rather detected in step S33 from the gradients that are ascertained in steps S19 and S31.

In step S35, the gradient change is compared with a lower or rather second threshold value. The second threshold value can be by way of example −0.05 mA/s$^2$. If the gradient change is less than the second threshold value, the first time stamp is set to the time t=n in step S37 and subsequently the method continues with step S39. If, on the other hand, the gradient change is greater than the second threshold value, then the method continues immediately with step S39. In step S39, the gradient change that has been ascertained in step S33 is compared with an upper or rather first threshold value. The first threshold value can be by way of example 0.03 mA/s$^2$. If the gradient change is greater than the first threshold value, then the second time stamp is set in step S41 to the time t=n. If, on the other hand, the gradient change is less than the first threshold value, then the method is continued with step S13. The comparison of the gradient change with a first and a second threshold value in steps S35 and S39 corresponds to a comparison of the gradient change of the current characteristic 1 with a gradient change range.

Step S43 can follow on from step S41. In step S43, the time interval, in other words the difference between the first time stamp and the second time stamp is compared with a fifth threshold value. The fifth threshold value can correspond by way of example to 20 seconds. The first time stamp or the second time stamp can have a different time value during a preceding cycle of steps S13 to S39. By way of example, the time stamp can be incremented after multiple cycles of steps S13 to S39 in each case at the points in time of the "bends".

If the time interval between the value of the first time stamp and the value of the second time stamp is less than the fifth threshold value, in other words for example less than 20 seconds, then the method is continued with step S13. If the difference between the first time stamp and the second time stamp is greater than the fifth threshold value, then the method is continued with step S45. A malfunction in the electric drive unit is established in step S45. In particular, the tank leakage diagnostic procedure can be interrupted. Alternatively, a defect signal can be output in step S45. Moreover, the method for detecting a malfunction in the electric drive unit is subsequently terminated in step S47.

In conclusion, it is noted that expressions such as "comprising" or similar do not exclude that additional elements or steps can be provided. Furthermore, reference is made to the fact that "a" or "an" do not exclude a multiplicity of components. In addition, features that are described in conjunction with the different embodiments can be combined with one another as desired. It is further noted that the reference numerals in the claims are not to be regarded as limiting the scope of the claims.

What is claimed is:
1. A method for detecting a malfunction in an electric drive unit, the method comprising the following steps:
   ascertaining a current flow characteristic of the electric drive unit;
   detecting a gradient change in the current flow characteristic at a first point in time;
   comparing the gradient change with a predefinable gradient change range;
   ascertaining a gradient in a current flow characteristic at a second point in time;
   comparing the gradient with a predefinable gradient range; and
   establishing a malfunction in the electric drive unit only if both the gradient change is outside the predefinable gradient change range and also the gradient is outside the gradient range, and a time interval between the first point in time and the second point in time exceeds a predefinable threshold value.

2. The method according to claim 1, wherein the malfunction in the electric drive unit is established when a rotor of the electric drive unit performs a radial oscillation in a resonance range.

3. The method according to claim 2, wherein the malfunction in the electric drive unit is established when the rotor of the electric drive unit outputs energy that is stored as a result of the oscillation in the resonance range.

4. The method according to claim 1, further comprising outputting a defect signal after a malfunction has been established.

5. The method according to claim 1,
   wherein the electric drive unit is part of a pressure source,
   wherein the current flow characteristic is ascertained as a pressure difference is introduced into a tank by means of the pressure source;
   wherein a conclusion regarding the presence of a leakage in the tank is drawn from the current flow characteristic; and
   wherein the method is part of a tank leakage diagnostic procedure.

6. The method according to claim 1, wherein the malfunction in the electric drive unit is established when a rotor of the electric drive unit performs a radial oscillation in a resonance range.

7. The method according to claim 6, wherein the malfunction in the electric drive unit is established when the rotor of the electric drive unit outputs energy that is stored as a result of the oscillation in the resonance range.

8. The method according to claim 7, further comprising outputting a defect signal after a malfunction has been established.

9. The method according to claim 8,
wherein the electric drive unit is part of a pressure source,
wherein the current flow characteristic is ascertained as a pressure difference is introduced into a tank by the pressure source;
wherein a conclusion regarding the presence of a leakage in the tank is drawn from the current flow characteristic; and
wherein the method is part of a tank leakage diagnostic procedure.

10. The method according to claim 1, wherein ascertaining the current flow characteristic of the electric drive unit comprises measuring motor current or measuring counter EMF of the electric drive unit.

11. The method according to claim 10, wherein the gradient change is determined in $mA/s^2$.

* * * * *